(12) United States Patent
Baumgartner et al.

(10) Patent No.: US 6,321,184 B1
(45) Date of Patent: Nov. 20, 2001

(54) REDUCTION OF ARBITRARY L1-L2 CIRCUITS FOR ENHANCED VERIFICATION

(75) Inventors: Jason Raymond Baumgartner, Austin, TX (US); Tamir Heyman, Haifa (IL)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/210,130

(22) Filed: Dec. 10, 1998

(51) Int. Cl.[7] ................................................. G06F 17/50
(52) U.S. Cl. ........................ 703/15; 703/14; 703/16; 716/5
(58) Field of Search .................. 703/14–16; 716/5, 716/6

(56) References Cited

U.S. PATENT DOCUMENTS

| | | | |
|---|---|---|---|
| 5,790,830 | * 8/1998 | Segal | 706/6 |
| 5,995,425 | * 11/1999 | Henkels et al. | 365/201 |
| 6,023,568 | * 2/2000 | Segal | 716/6 |
| 6,049,662 | * 4/2000 | Saha et al. | 703/16 |
| 6,058,252 | * 5/2000 | Noll et al. | 716/10 |

OTHER PUBLICATIONS

Gerst et al., "A General Method to Double Cycle Simulation Speed", Proceedings of the Tenth Annual IEEE International ASIC Conference and Exhibit, pp. 356–359, Sep. 1997.*

IBM Technical Disclosure Bulletin, "Single–Latch Element Modeling Technique", vol. 36, No. 08, Aug. 1993, pp. 355–356.*

IBM Technical Disclosure Bulletin, "Modelling Technique for Master/Slave LSSD Latches with Gated Clocks", vol. 36, No. 09A, Sep. 1993, pp. 155–157.*

IBM Technical Disclosure Bulletin, "Latch Model Reduction Using Latch Behaviorals", vol. 31, No. 09, Feb. 1989, pp. 471–473.*

* cited by examiner

Primary Examiner—Kevin J. Teska
Assistant Examiner—Douglas W. Sergent
(74) Attorney, Agent, or Firm—Joseph P. Lally; Leslie A. Van Leeuwen

(57) ABSTRACT

A method of generating a digital circuit model that has fewer latches than the circuit being modeled. Initially, a determination of whether the digital circuit is reducible is made. The digital circuit suitably includes one or more primary inputs, one or more primary outputs, and a plurality of latches comprised of a level one (L1) latch set and a level two (L2) latch set wherein the latch sets may or may not lack one-to-one correspondence. After determining that the digital circuit is reducible, at least one of the latches is replaced with combinational logic thereby reducing the latch count of the digital circuit model. Preferably, the determination of whether the digital circuit is reducible is accomplished by determining whether (a) the transitive fanin of the L1 latch set includes only the primary inputs of the digital circuit and outputs of the L2 latch set, (b) the transitive fanout of the L1 latch set includes only inputs to the L2 latch set, (c) the transitive fanin of the L2 latch set includes only out puts from the L1 latch set, and (d) the transitive fanout of the L2 latch set includes only the primary outputs of the digital circuit and inputs to the L1 latch set. In the preferred embodiment, the replacement of the latch(es) is made by identifying either the latch set with the higher latch count as the replaceable latch set and replacing each its latches with combinational logic such as a simple wire or a multiplexed useful for retaining an initial condition of the digital circuit in the circuit model.

19 Claims, 6 Drawing Sheets

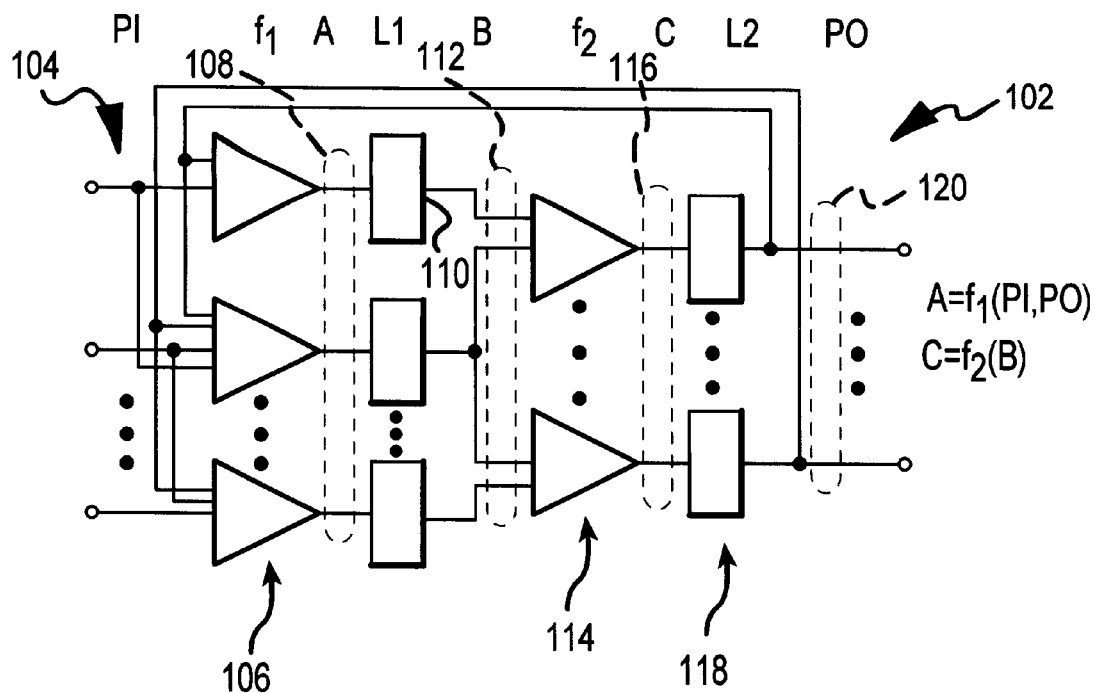
FIG.1
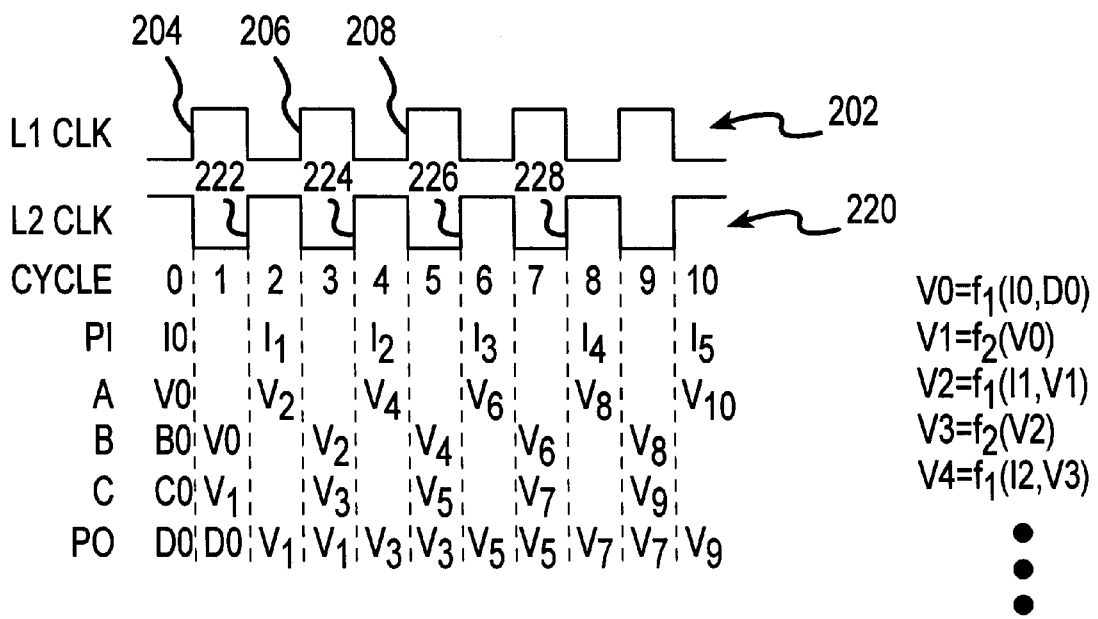
FIG.2
$V_0 = f_1(I_0, D_0)$
$V_1 = f_2(V_0)$
$V_2 = f_1(I_1, V_1)$
$V_3 = f_2(V_2)$
$V_4 = f_1(I_2, V_3)$
⋮
FIG.3

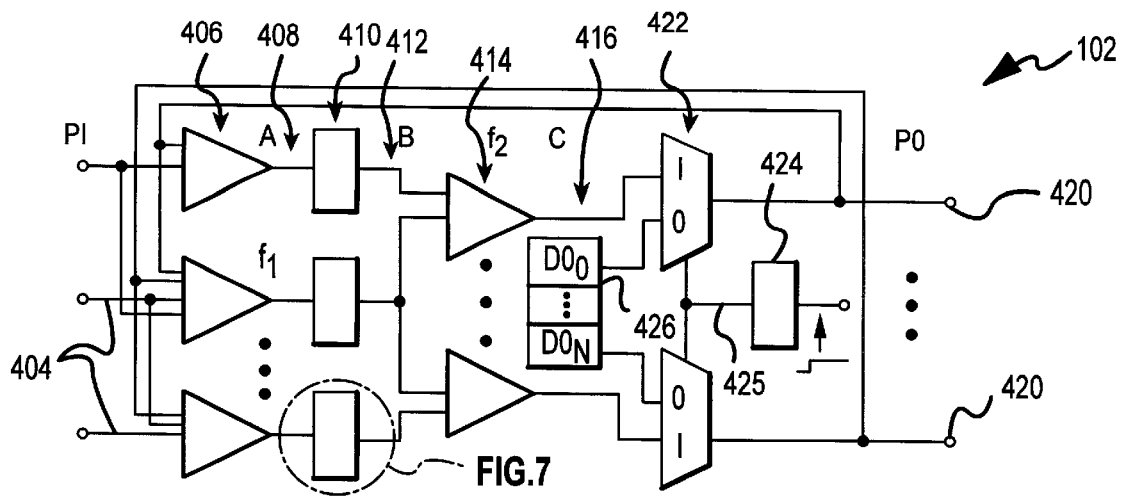
FIG.4
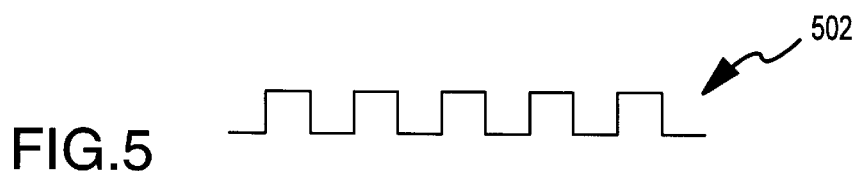
FIG.5
| CYCLE | 0 | 1 | 2 | 3 | 4 | 5 | 6 | 7 | 8 | 9 |
|---|---|---|---|---|---|---|---|---|---|---|
| PI | I0 | | I1 | | I2 | | I3 | | I4 | |
| A | V0 | | V2 | | V4 | | V6 | | V8 | |
| B | B0 | V0 | | V2 | | V4 | | V6 | | V8 |
| C | C0 | V1 | | V3 | | V5 | | V7 | | V9 |
| PO | D0 | V1 | | V3 | V3 | V5 | | V7 | | V9 |
FIG.6
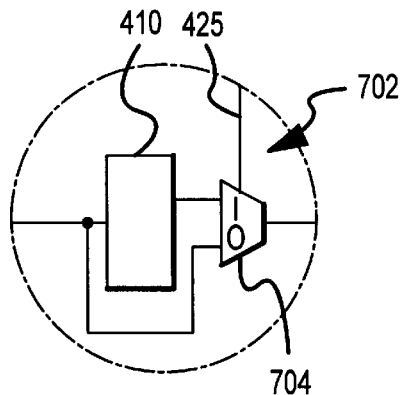
FIG.7

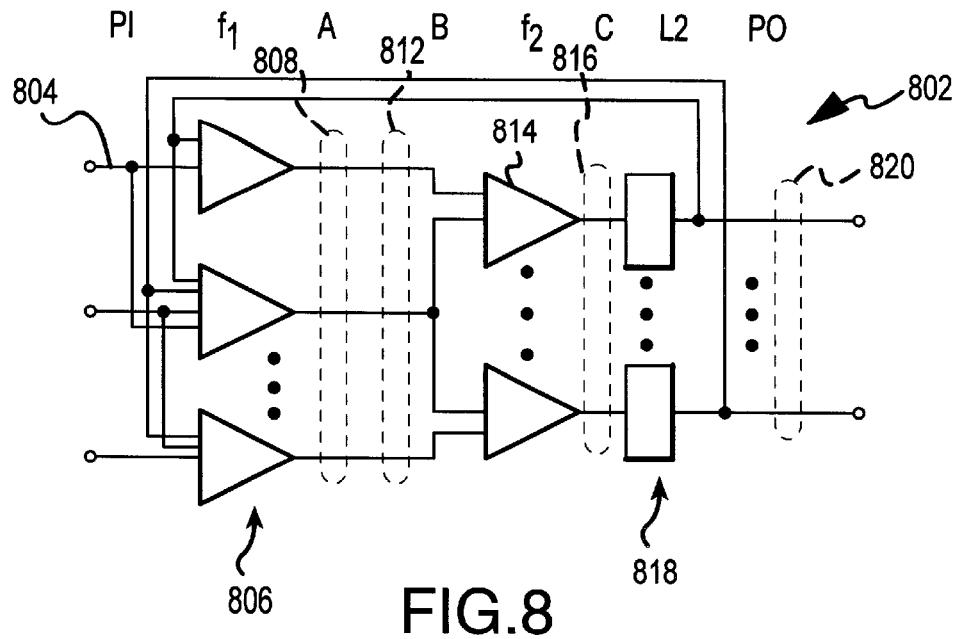
FIG.8
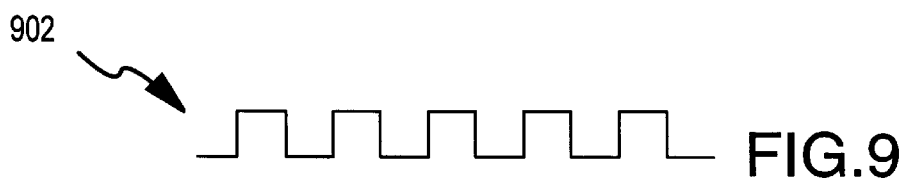
FIG.9
| PI | I0 | | I1 | | I2 | | I3 | | I4 | | I5 |
|---|---|---|---|---|---|---|---|---|---|---|---|
| A | V0 | | V2 | | V4 | | V6 | | V8 | | V10 |
| B | V0 | | V2 | | V4 | V4 | V6 | | V8 | | V10 |
| C | V1 | | V3 | | V5 | V5 | V7 | | V9 | | |
| PO | D0 | V1 | | V3 | | V3 | | V7 | | V9 | |
FIG.10
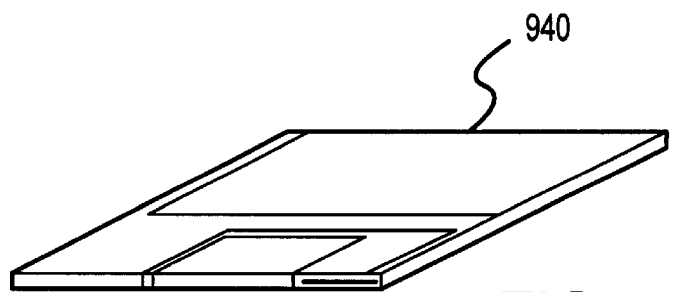
FIG.11

REDUCTION OF ARBITRARY L1-L2 CIRCUITS FOR ENHANCED VERIFICATION

BACKGROUND

1. Field of the Present Invention

The present invention generally relates to the field of digital circuits and more specifically to a mechanism for reducing latch counts of arbitrary L1–L2 digital circuit models to simplify verification and simulation tasks.

2. History of Related Art

While sequential digital circuits comprised of two latch sets (L1 and L2) driven by opposite phase clock signals have been well known for some time, conventional such circuits tend to include relatively simple combinational logic between the latch sets. In addition, these circuits tend to exhibit a one-to-one correspondence between latch sets such that each latch within the L1 latch set corresponded to a single L2 latch. The demand for extremely high speed and sophisticated sequential circuits, however, has resulted in a breakdown of this conventional design scheme. Combinational logic of ever increasing complexity is being placed between the L1 and L2 latch sets resulting in L1–L2 circuits lacking a simple correspondence between the latches of the L1 latch set and the latches of the L2 latch set. While these more complex circuits are required to deliver ever increasing functionality and performance, they have had a negative impact on the design cycle time, particularly in the simulation and verification phases of the design process. Simulation and verification of conventional L1–L2 circuits could be readily managed by simply collapsing the L1–L2 pairs into a single latch for modeling purposes. Halving the number of latches is highly desirable for model checking because of the exponential relationship between the number of latches and the state space of the circuit (where the circuit's state space refers to the universe of states that the circuit could conceivably occupy). In addition, because the collapsed model requires only one clock signal, verification of a particular sequence of events may be accomplished in N simulated clock transitions whereas the actual circuit would require 2N clock transitions, increased simulation capacity is achieved. Regrettably, however, because existing algorithms for collapsing L1–L2 pairs of conventional sequential circuitry depend upon a simple and direct correspondence between the L1 latches and the L2 latches, these algorithms are no longer effective in providing reduced models of arbitrary dual phase L1–L2 circuits.

SUMMARY OF THE INVENTION

The problems identified above are in large part addressed by a method for generating a model of an arbitrary circuit with a reduced latch count. Broadly speaking, the present invention contemplates a method of generating a digital circuit model that has fewer latches than the circuit being modeled. A determination of whether the digital circuit is reducible is made. The digital circuit suitably includes one or more primary inputs, one or more primary outputs, and a plurality of latches comprised of a level one (L1) latch set and a level two (L2) latch set. In one embodiment, the latch sets lack one-to-one correspondence. After determining that the digital circuit is reducible, one of the latch sets is replaced with combinational logic thereby reducing the latch count of the digital circuit model. In the preferred embodiment, at least half of the latches in the digital circuit are replaced.

Preferably, the determination of whether the digital circuit is reducible is accomplished by determining whether the digital circuit complies with the following four conditions: (a) the transitive fanout of the L1 latch set includes only primary inputs of the digital circuit and outputs of the L2 latch set, (b) the transitive fanout of the L1 latch set includes only inputs to the L2 latch set, (c) the transitive fanin of the L2 latch set includes only outputs from the L1 latch set, and (d) the transitive fanout of the L2 latch set includes only primary outputs of the digital circuit and inputs to the L1 latch set. In the preferred embodiment, the replacement of the latch(es) is made by identifying either the L1 latch set or the L2 latch set as a replaceable latch set and replacing each latch of the replaceable latch set with combinational logic. The L1 latch set is preferably identified as the replaceable latch set if its latch count is greater than the latch count of the L2 latch set. Similarly, the L2 latch set is identified as the replaceable latch sets if the L2 latch count is greater than the L1 latch count. (In the event of a tie, the L1 latch set is preferred to be removed since removal of the L1 latch does not require additional mux circuits to simulate initial an initial output condition of the circuit as discussed below.) Each latch of the replaceable latch set is replaced with a simple wire or, in an alternative embodiment, with a circuit such as a multiplexer (mux). An initialization latch may be included in the model to drive a select input of each mux. Means for modeling a predetermined initial condition of the primary outputs during an initial clock cycle is further provided in one exemplary embodiment.

The present invention further contemplates a storage medium configured with computer instructions for generating a model of a digital circuit comprised of primary inputs, primary outputs, combinational logic, and a plurality of latches. The plurality of latches are organized as an L1 latch set and an L2 latch set where the latch sets may or may not lack one-to-one correspondence. A replaceable latch set is then identified from the group consisting of the L1 latch set and the L2 latch set if the digital circuit is reducible and each latch of the replaceable latch set is replaced with combinational logic. In one embodiment, the storage medium is configured with instructions to determine the reducibility of the digital circuit by an iterative process including: traversing a transitive fanout path of a primary input to discover previously unidentified L1 latches and marking the digital circuit as irreducible if any of the L2 latches are encountered, traversing a transitive fanout path of each previously unidentified L1 latch to discover previously unidentified L2 latches and marking the digital circuit as irreducible if any L1 latches are encountered, and traversing a transitive fanout and fanin path of each previously unidentified L2 latch to discover any previously unidentified L1 latches and marking the digital circuit as irreducible if any L2 latches are encountered. These steps are repeated, for each primary input of the circuit, until no previously undiscovered latches are encountered. Preferably the latch count of the L1 and L2 latch sets are tracked and incremented for each previously undiscovered latch. The replaceable latch set is typically the latch set with the highest latch count (or the L1 latch set in the event of a tie).

The present invention still further comprises a computer system including a storage medium containing a representation of a digital circuit comprised of primary inputs, primary outputs, combinational logic, and a plurality of latches organized as L1 and L2 latch sets. The latch sets may lack a one-to-one correspondence. A processor of the computer system, which is coupled to the storage medium, is suitable for executing computer instructions. The storage medium further includes a plurality of computer instructions suitable for determining whether the digital circuit is reducible and, if so, creating a model of the digital circuit wherein at least one half of the plurality of latches of the digital circuit is replaced in the model by combinational logic. Preferably, the computer system determines whether the digital circuit is reducible according to the four criteria referred to previously.

BRIEF DESCRIPTION OF THE DRAWINGS

Other objects and advantages of the invention will become apparent upon reading the following detailed description and upon reference to the accompanying drawings in which:

FIG. 1 is a block diagram of an arbitrary L1–L2 digital circuit lacking one-to-one correspondence between the L1 latch set and the L2 latch set;

FIG. 2 is a timing diagram of representative clock cycles for the L1 and L2 latch sets of FIG. 1;

FIG. 3 is a state transition table representing the states of various nodes on the digital circuit of FIG. 1;

FIG. 4 is a block diagram of a model of the digital circuit of FIG. 1 in which the L2 latch set has been replaced by combinational logic including a plurality of muxes and an initialization latch for retaining an initial condition on the outputs of the digital circuit model;

FIG. 5 is a timing diagram of representative clock cycles for the circuit of FIG. 4;

FIG. 6 is a state transition diagram for the circuit of FIG. 4;

FIG. 7 is an alternative embodiment for each L1 latch circuit of FIG. 4;

FIG. 8 is a block diagram of a model of the digital circuit of FIG. 1 in which each latch of the L1 latch set has been replaced with a simple wire;

FIG. 9 is a timing diagram of a representative clock signal for the circuit of FIG. 8;

FIG. 10 is a state transition table for the circuit of FIG. 8;

FIG. 11 is a perspective drawing of a storage medium according to the present invention;

Figure 12:
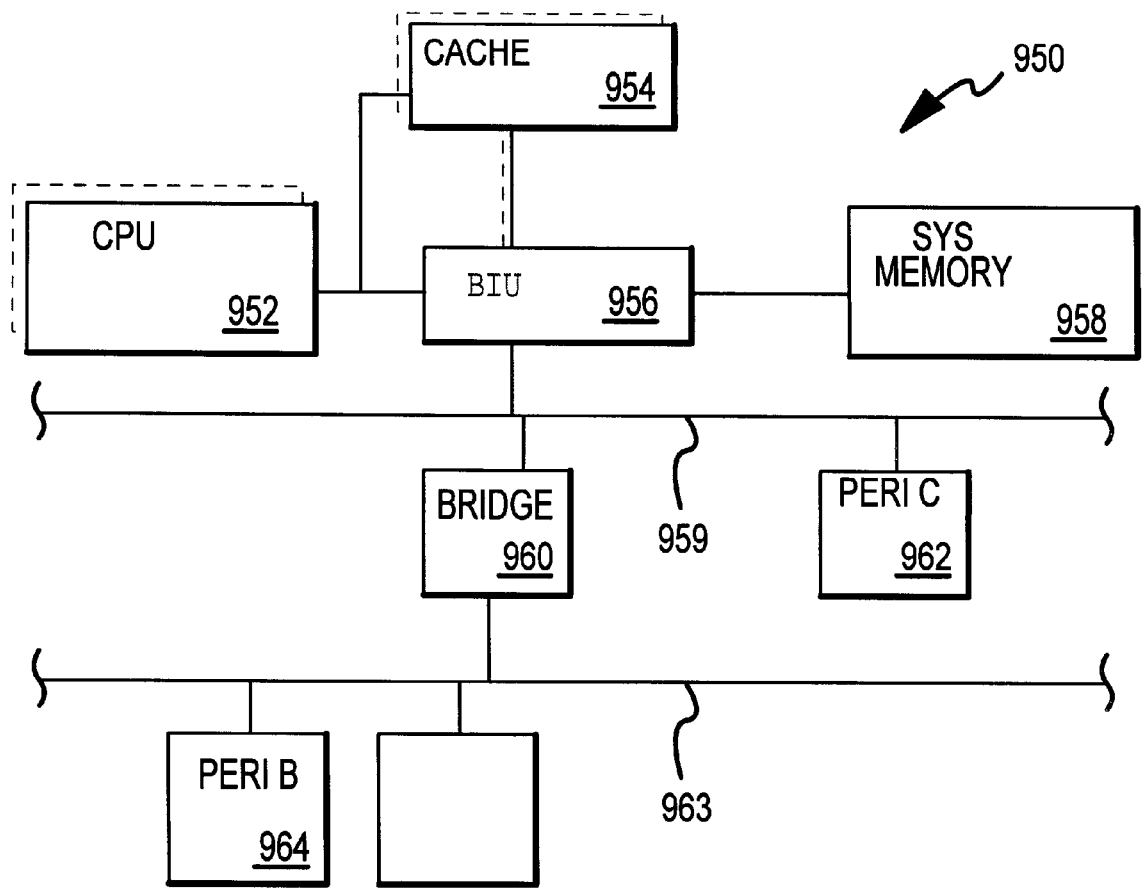
FIG. 12 is a simplified block diagram of a computer system according to the present invention.

While the invention is susceptible to various modifications and alternative forms, specific embodiments thereof are shown by way of example in the drawings and will herein be described in detail. It should be understood, however, that the drawings and detailed description presented are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF A PREFERRED EMBODIMENT OF THE PRESENT INVENTION

Turning now to the drawings, FIG. 1 is a block diagram of an arbitrary L1–L2 circuit 102 typical of modern high speed sequential logic. Circuit 102 includes primary inputs 104, primary outputs 120, and a plurality of latches organized as a level one (L1) latch set 110 and a level two (L2) latch set 118. In the depicted embodiment, circuit 102 further includes first combinational logic 106 and second combinational logic 114. For purposes of this disclosure, combinational logic refers to a circuit in which the time required for the circuit's output to signals respond to changes in the circuit's input signals is limited only by the propagation delay of the circuit (i.e., combinational logic does not depend upon a clock signal to produce a state change). Typically, a first clock signal 202, as shown in the timing diagram of FIG. 2, drives L1 latch set 110 while a second clock signal 220 drives L2 latch set 118. Clock signals 202 and 220 typically have the same period, but are shifted 180° out of phase from each other such that first clock signal 202 transitions from low to high when second clock signal 220 transitions from high to level and vice versa. L1 latch set 110 includes all latches driven by primary inputs 104 of circuit 102 while L2 latch set 118 includes all latches that are driven by the transitive fanout of L1 latch set 110. For purposes of this disclosure, the term transitive fanout refers to circuit elements driven directly (combinatorially, without passing through a latch) by a signal, as well as circuit elements driven by those directly driven nodes, and so on, terminating only when a latch or primary input/output is reached. In other words, the transitive fanout includes all nodes driven either directly or indirectly by a signal. Similarly, the transitive fanin of a node refers to all circuit elements that drive the node, either directly or indirectly. The concepts of transitive fanout and transitive fanin are utilized herein to permit analysis of an L1–L2 circuit without getting unnecessarily bogged down in the details of combinational logic circuits 106 and 114.

Circuit 102 as conceived herein is arbitrary in that the number of latches within L1 latch set 110 is independent of the number of latches within L2 latch set 118. In the depicted embodiment, L1 latch set 110, L2 latch set 118, and the number of primary inputs and outputs and the type of combinatorial logic are all independent and arbitrary. In one particularly interesting embodiment, L1 latch set 110 and L2 latch set 118 lack one-to-one correspondence thereby making them unlikely candidates for meaningful circuit reduction using conventional model reduction algorithms. The inability of conventional algorithms to reduce arbitrary circuits such as circuit 102 does not mean, however, that circuit 102 is inherently irreducible. The present invention contemplates determining the reducibility of an arbitrary dual phase L1–L2 circuit and generating a reduced model of the circuit if it is reducible. Thus, while L1 latch set 110 and L2 latch set 118 of circuit 102 may correspond on a latch-for-latch basis, the invention does not so restrict circuit 102, but instead permits circuit 102 to be lacking, even extremely lacking, in such one-to-one correspondence.

FIG. 3 presents a state transition table of circuit 102. The table uses vector notation wherein, for example, V0 is the vector present on node A 108 during cycle 0. The functions performed by first and second combinational circuits 106 and 114 are notated as $f_1$ and $f_2$ respectively. Reviewing the table, it will be appreciated that each node of FIG. 1, namely, node A 108, node B 112, node C 116, and node PO 120, varies only once every two clock transitions (clock transitions 204, 206, and 208 of first clock signal 202 and clock transitions 222, 224, 226, and 228 of second clock signal 228 are specifically enumerated). This is characteristic of L1–L2 circuits that are reducible. An arbitrary dual phase L1–L2 circuit is reducible only if each node of the circuit transitions in response to only one of the dual clocks. This condition will hold true if outputs of L1 latch set 110 do not drive L1 inputs and if outputs of L2 latch set 118 do not drive L2 inputs. In addition, it will be observed that outputs of L1 latch set 110 do not drive primary outputs 120 and that primary inputs 104 do not drive inputs of L2 latch set 118. From these observations, circuit 102 is reducible if the following conditions are true: (a) L1 outputs drive L2 inputs only; (b) L2 inputs are driven by L1 outputs only; (c) L1 inputs are driven by primary inputs and L2 outputs only; and (d) primary outputs are driven by L2 outputs only. If each of these conditions is met, circuit 102 may be reduced for modeling purposes according to the present invention.

Turning now to FIGS. 4 through 7, a reduced model 402 of circuit 102 is present Review of the embodiment depicted in the circuit block diagram of FIG. 4 reveals that L2 latch set 118 of digital circuit 102 has been replaced by combinational logic 422 thereby resulting in a reduced latch count for model 402. Thus, model 402 of circuit 102 includes primary inputs 404, first combinational circuitry 406, an L1 latch set 410, second combinational circuitry 414, and primary outputs 420 all as in their corresponding features within digital circuit 102. In the depicted embodiment, however, combinational logic in the form of a plurality of 2:1 multiplexers (muxes) 422 has replaced L2 latch set 118 of digital circuit 102. In this embodiment, muxes 422 are used to preserve the ability to simulate a desired initial state of primary outputs 420. Without this ability, an undesired initial state present at primary outputs 420 of model 402 could be fed back to the inputs of first combinational circuit 406 and propagated through model 420 producing undesired results.

A predetermined constant vector 426 is applied to the "0" inputs of each of the muxes 422. In a preferred embodiment, vector constant 426 is a reproduction of an initial state D0 (as shown in the FIG. 3 state transition table). In addition, an initialization latch 424 is shown in FIG. 4 as driving the select inputs of each mux 422. Initialization latch is preferably configured to output an initialization signal 425 which is "0" during an initial cycle of the circuit clock signal and "1" thereafter. The "1" inputs of each mux 422 are connected to a corresponding output of node C 416. After the initial clock cycle, therefore, node C 416 is passed directly to primary outputs 420 of model 402. Accordingly, combinational logic 422 as shown in FIG. 1 essentially passes the node C vector directly to primary outputs 420 during all but the initial cycle of clock signal 502. In an embodiment in which it is not necessary to preserve initial output state D0, combinational logic 422 may be comprised simply of a plurality of wires connecting node C 416 to primary output 420. Comparison of the FIG. 6 state transition table of model 402 (in which the initial state of primary outputs 420 is forced with the vector constant 426 to assume the D0 state during cycle 0) with the FIG. 3 state transition table of digital circuit 102 reveals cycle by cycle equivalence between the two tables. Furthermore, it will be appreciated that only the even cycles (i.e., cycles 0, 2, 4 . . . ) of FIG. 6 are of interest since the odd cycles of FIG. 6 do not strictly correlate to any state of digital circuit 102 and need not be generated within a verification framework. This observation is consistent with the elimination of the L2 latch set 118 from the model 402. Whereas digital circuit 102 required a transition of its L1 clock and a corresponding transition of the L2 clock to effect a complete transition in circuit 102, model 402 completes a state change with every positive going transition of its L1 clock, Thus, it will be appreciated that the state transition sequence of FIG. 5 is simulated by model 402 with half the clock transitions required to execute the corresponding state transition sequence with dual phase digital circuit 102 thus providing increased simulation capacity.

Returning briefly to FIG. 3 reveals an initial state denoted as B0 on node B 112 of circuit 102 during cycle 0. This initial state is overwritten by the initial state of node A 108 during transition 204 of clock signal 202 (FIG. 2) and does not, therefore, propagate through circuit 102. In an embodiment in which it may be desirable to eliminate this essentially unused state, each output of L1 latch set 410 in model 402 may be replaced with a bypass circuit 702 as shown in FIG. 7. In the depicted embodiment, bypass circuit 702 includes a 2:1 mux 704. The "0" input of mux 704 is connected to an input of a corresponding latch within L1 latch set 410 while the "1" input of mux 704 is connected to the output of the latch. Initialization signal 425, as described previously with respect to FIG. 4, drives a select input of mux 704. In this fashion, the initial condition B0 of node B 412 of model 402 is eliminated. During cycle 0, node B 412 is directly connected to node A 408, bypassing latch set 410, such that node B assumes the initial state (V0) of node A 408 while, during all subsequent cycles of clock signal 502, node B 412 is isolated from node A 408 by L1 latch set 410 as in digital circuit 102.

Turning now to FIGS. 8 through 10, a model 802 of digital circuit 102 is depicted. Model 802 achieves a reduced latch count by replacing L1 latch set 110 of circuit 102 with combinational (non-clocked) logic comprised of a set of simple wires. Node A 808 and node B 812 are shorted thereby eliminating L1 latch set 110 of circuit 102 in its entirety. FIG. 10 is a state transition table for model 802 corresponding to clock signal 902 shown in FIG. 9. In the same manner that only the even cycles of model 402 (discussed previously) corresponded to actual states of circuit 102, only the odd cycles of model 802 correspond to actual states and thus only the odd cycles of FIG. 10 are required in a simulation or verification framework. The FIG. 10 transition table indicates cycle by equivalence with the FIG. 3 transition table of circuit 102 with the exception of the initial states of node B 812 and node C 816. Because node A 808 and node B 812 are common, the initial state B0 of node B 112 in circuit 102 is not maintained in model 802. As discussed previously, however, initial state B0 of node B 112 is overwritten before it is permitted to propagate and is, therefore, generally of little concern in modeling the functionality of circuit 102. In the event that it is nevertheless desirable to retain initial state B0, suitable circuitry is incorporated into model 802. One example (not shown) of such suitable circuitry incorporates isolation means such as a switch in series between each wire of node A 808 and a corresponding wire of node B 812. The control signal of each switch, such as the gate terminal of an MOS transistor, could be driven by a signal analogous to initialization signal 425 of FIG. 4. During cycle 0 of clock 902, output terminals of each switch (such as the source and drain terminals of an MOS transistor) would be isolated, thereby permitting the driving of initial condition B0 onto node 812, possibly through the use of a set of muxes in a fashion similar to the use of muxes to preserve initial condition D0 on the output terminals of model 402 discussed previously.

Figure 13:
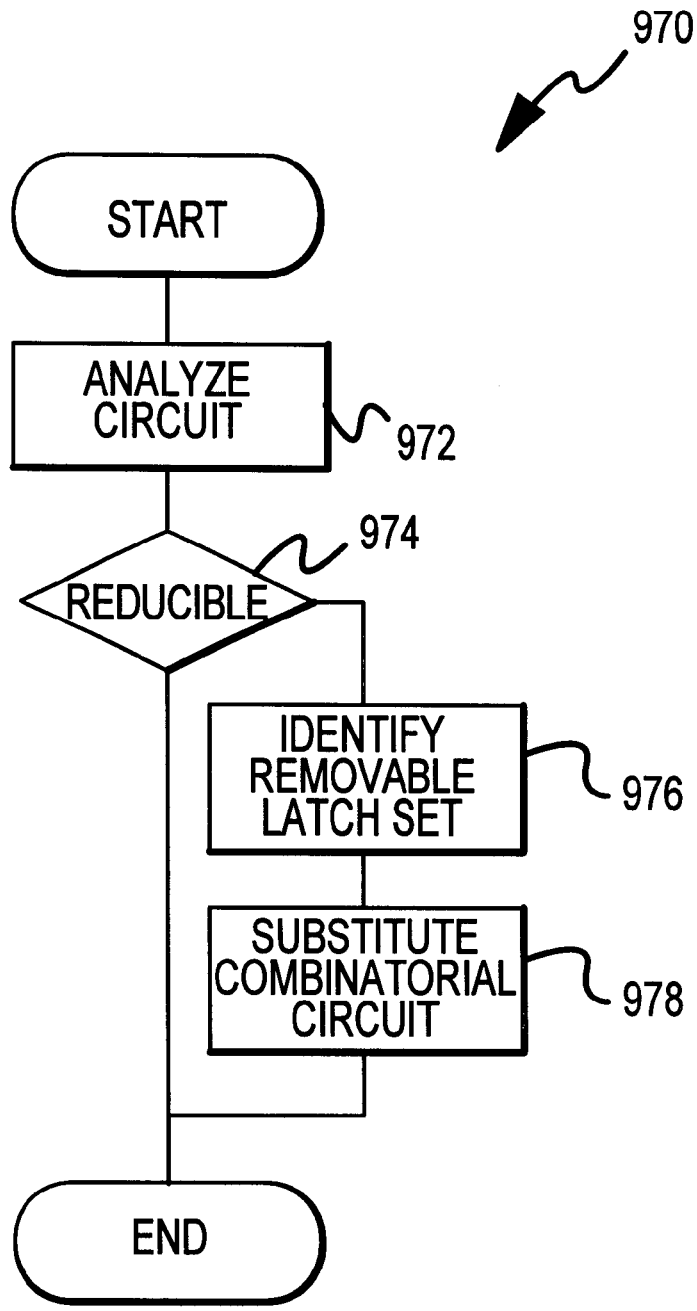
FIG. 13 is a high level flow chart of the method of the present invention.

FIG. 13 is a flow diagram of a method 970 for reducing the latch count of digital circuit 102 according to the present invention. It is observed that model 402 discussed previously with respect to FIGS. 4 through 7 effectively eliminated L2 latch set 118 from circuit 102 while model 802 discussed previously with respect to FIGS. 8 through 10 effectively eliminated L1 latch set 110 from circuit 102. The present invention preferably contemplates, in addition to determining if circuit 102 is replaceable, identifying either L1 latch set 110 or L2 latch set 118 as a replaceable latch set and replacing the identified latch set with combinational logic such as the wires or muxes disclosed in the preceding discussion. In the preferred embodiment, the identification of the replaceable latch set is made by determining which of the two latch sets has the greater latch count. In this embodiment, maximum circuit reduction is achieved by eliminating the latch set with the highest latch count. In the event that the L1 latch count and L2 latch count are equal, the L1 latch set is preferably selected as the replaceable latch set because replacing the L1 latch set does not require the addition of mux circuits to preserve the circuit's initial output condition. In FIG. 13, the determination of whether circuit 102 is reducible is made in step 972 where circuit 102 is analyzed and in step 974, where method 970 is directed to the reduction process if circuit 102 is reducible. In step 976, method 970 identifies which of the two latch sets is appropriate for removal. Finally, combinational circuitry is substituted for each latch within the replaceable latch set in step 978.

Figure 14:
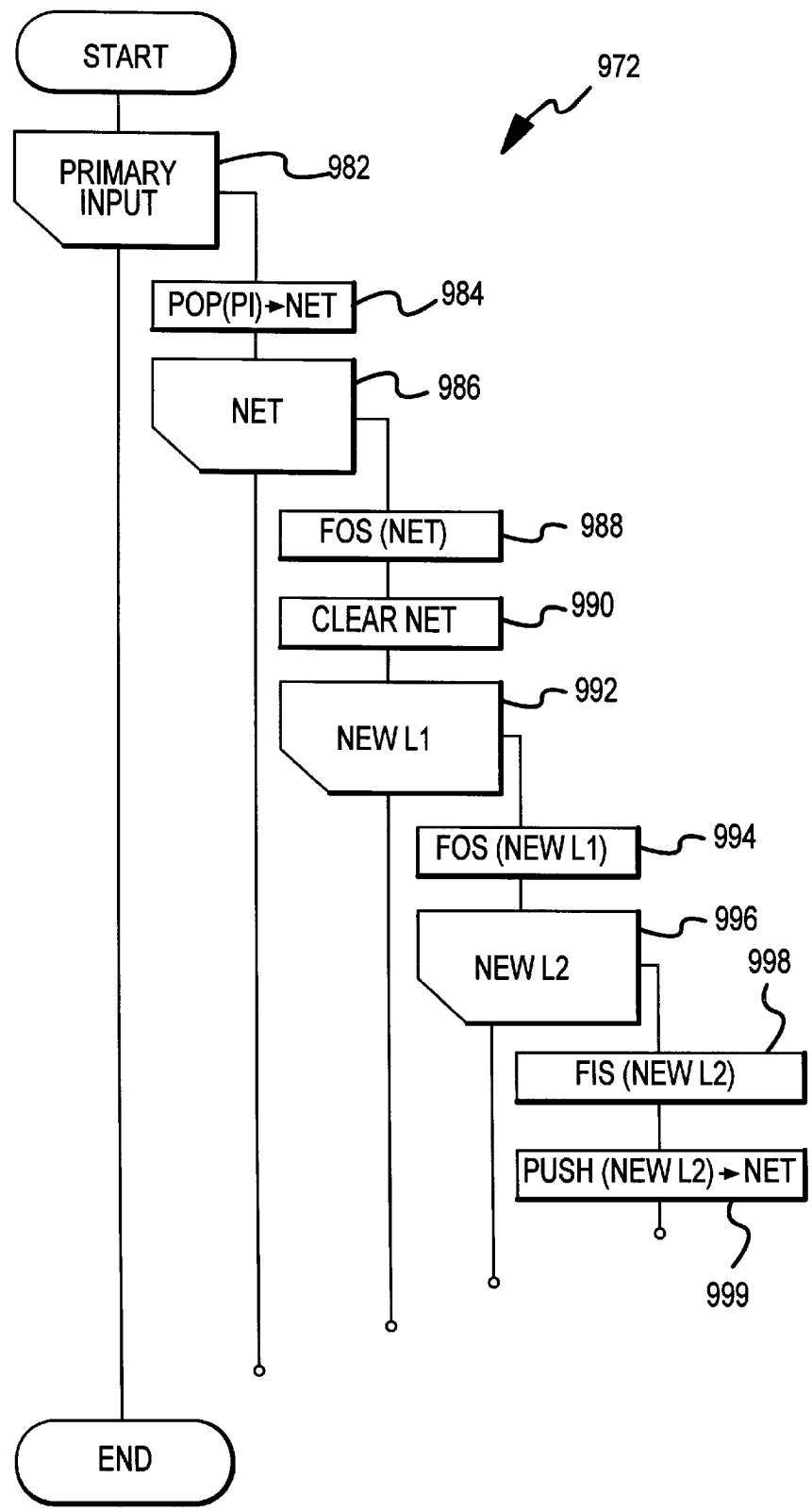
FIG. 14 is a flow diagram in greater detail of one embodiment of the present invention.

Turning to FIG. 14, a flow diagram is presented depicting one embodiment of analysis step 972 in FIG. 13 for determining whether circuit 102 is reducible. [Appendix A to this disclosure presents pseudocode representative of the method depicted in FIG. 14.] This embodiment includes a series of nested loops during which the transitive fanin and fanout of various nodes are made to determine the architectural structure of circuit 102. The outermost loop iterates once for each primary input 104 of circuit 102. This primary input is first pushed into a NET variable, which is suitably implemented as a stack or hash table, in step 984. In step 986, a subordinate loop is initiated during which a transitive fanout search (FOS) of the nodes in the NET variable is executed in step 988. The FOS function sets a REDUCIBLE variable to FALSE if the fanout of any primary input terminates at an input to an L2 latch and pushes a node into an NEW L1 variable for each previously undiscovered L1 latch encountered in the transitive fanout of the primary input being investigated. The NET variable is then cleared in step 990 and a subordinate loop 992 executed for each previously undiscovered L1 latch found in the fanout search of step 988. In loop 992, the FOS function is executed in step 994 for each previously undiscovered L1 latch discovered in step 984 to insure that the fanout of each L1 latch terminates on an L2 circuit and to push any previously undiscovered L2 latches into the NEW L2 variable, which will be evaluated in a subordinate loop as discussed below. It bears repeating at this point that transitive fanout searches are not concerned with intervening combinational (non-clocked) circuitry. Thus the fanout search of each node branch terminates when, but not until a latch or primary output is encountered. If the fanout search of any L1 latch terminates at a primary output 120 or the input to a latch of L1 latch set 110, the REDUCIBLE variable is set to FALSE and the search terminated. If the step 994 FOS function does not return a FALSE value for the REDUCIBLE variable, the loop indicated by reference numeral 996 is executed for each previously undiscovered L2 latch encountered during the fanout search of step 994. A fanin search of each previously undiscovered L2 latch is executed in step 998. The fanin search is analogous to the fanout search in that it traverses the transitive fanin of a node until a latch or primary input is encountered. As in the transitive fanout search, combinational circuit is ignored for purposes of determining the reducibility of circuit 102. The fanin search of step 998 preferably sets the REDUCIBLE variable to FALSE if any primary inputs or L2 latches are discovered in the transitive fanin of an L2 latch and pops any previously undiscovered L1 latches into the NEW L1 variable. After the fanin search of step 998, each L2 latch that was discovered in fanout search 994 is pushed into NET so that the fanout of these previously undiscovered L2 latches will be traversed in a subsequent iteration of loop 986. Those familiar with flow diagrams will appreciate that loops 992 and 996 execute in an alternating fashion until no previously undiscovered latches are found (or until REDUCIBLE is set to FALSE). Loop 986 is then repeated if any nodes were popped into NET during an iteration of loop 996. This process continues until the transitive fanout and fanin of each latch associated with the primary input under investigation is complete. Loop 982 is then repeated for each primary input 104 in circuit 102. In an embodiment in which the replaceable latch set is the latch set with the highest latch count (or the L1 latch set in the event of a tie), each of the fanout and fanin functions indicated in FIG. 14 may further include a step of incrementing L1 COUNT and L2 COUNT variables as appropriate. At the end of the analysis, the latch set to be removed is selected by simply comparing L1 COUNT with L2 COUNT. If L1 COUNT and L2 COUNT are equal, the L1 latch set is preferably replaced. The L1 COUNT and L2 COUNT variables are preferably set up as array variables to track latch set cardinality per dependent pair layer (as discussed in greater detail below). In such an embodiment, the latch reduction is based on the greater latch count in each dependent layer such that the L2 latch set may be replaced in one dependent layer while the L1 latch set replaced in another.

Although not specifically indicated in the flow diagrams discussed in the preceding paragraphs, the cur_pair variable of the pseudocode presented in Appendix A is used to keep track of the current dependent pair level. As implemented in the pseudocode, the invention not only determines reducibility of circuit 102, but also maximizes latch count reduction by reducing circuit 102 to its minimal dependent pairs and then eliminating the latch set within each minimal dependent pair that includes the largest number of latches. The dependent layer selection proceeds as the algorithm proceeds, breaking circuit 102 into smaller sets of dependent latch pair levels. Because each of the dependent pairs is minimal, the number of such pairs is maximal. By then eliminating the latch set within each dependent pair with the highest latch count, the latch count reduction is maximized. The cur_pair variable facilitates this dependent pair analysis by tracking the dependent pair level currently under analysis and providing an index into the latch count variables, which are suitably implemented as arrays.

In addition to determining the reducibility of a circuit, it will be appreciated that the present invention is suitable for verification as well. In other words, the present invention may be used to verify that a particular circuit, which is intended to comply with the L1–L2 rules includes no wiring prohibited by the rules (i.e., no L1 latches driving L1 latches, no primary inputs driving L2 latches, etc.) Thus the present invention contemplates a verification tool that functions in the manner described herein, but is applied to a known circuit that is intended to be designed in accordance with the rules, to verify whether or not the designed circuit meets the criteria.

It will be appreciated that the methods described above with respect to FIGS. 13 and 14 may be readily incorporated as a sequence of computer instructions. Accordingly, one embodiment of the present invention contemplates a storage medium configured with computer instructions for performing the methods of FIGS. 13 and 14. In one embodiment, such computer instructions may substantially replicate the pseudo code disclosed in Appendix A to this disclosure. The storage medium may comprise any of a variety of storage mediums familiar to makers and users of computer systems. FIG. 11 depicts one such suitable store medium 940, comprised of a 3.25" floppy diskette, and configured with computer instructions suitable for execution on a computer system for carrying out the methods of the present invention as described previously. In alternative embodiments, the storage medium may be comprised of a magnetic hard disk, a CD ROM, or the system memory (DRAM) of a computer system. An exemplary such computer system 950 is shown in FIG. 12. Computer system 950 includes a central processing unit 962 coupled to a cache memory 954 and a bus interface unit 956. Bus interface unit 956 is connected to system memory 958 and a system bus 956. Although the embodiment of computer system 950 depicted includes only a single CPU, additional CPU's (and accompanying caches and bus interface units) may be connected to system bus 959. A bus bridge 960 is further shown as connected between system bus 959 and a peripheral bus 963 to which peripheral devices indicated by reference number 964 may be connected. System memory 958 is suitably configured with computer instructions executable by CPU 952 for carrying out the methods described herein.

It will be apparent to those skilled in the art having the benefit of this disclosure that the present invention contemplates a method and computer instructions for improving the verification and modeling of a digital circuit by producing a model of the circuit with a reduced latch count thereby exponentially reducing the computer memory and time consumed by formal verification and linearly increasing simulation throughput. It is understood that the form of the invention shown and described in the detailed description and the drawings are to be taken merely as presently preferred examples. It is intended that the following claims be interpreted broadly to embrace all the variations of the preferred embodiments disclosed.

APPENDIX A

```
int cur_pair = 0; // used to differentiate unique pairs
HT ALL_L1 = ALL_L2 = NEW_L1 = NEW_L1 = NULL; // Hash tables for L1 and L2 latch sets
STACK INPUTS = Primary Inputs(Network); // returns all PI's of network to be verified
while (INPUTS != empty) {// loop for each PI of network to be verified
        STACK NETS.push(INPUTS.pop()); // pop into NETS from INPUTS stack
        while (REDUCIBLE && NETS) {// NETS is either PI or L2 latch(es) whose fanout has yet to be
        traversed
                // foreach_TFOLatch_And_PO looks for all latches and PI's in the
                // transitive fanout of the signals in NETS and stops traversing when
                // a latch or PO is encountered. "node" is the returned latch or PO.
                while (node = foreach_TFOLatch_And_PO(NETS)) {
                        if (ALL_L2.is_member(node)) {
                                REDUCIBLE = FALSE; //violates Reducible rules
                                break;
                        }; // end if
                        // process node if not previously encountered and not a PO
                        if (!ALL_L1.is_member(node) && !IsPO(node)) {
                                ALL_L1.insert(node, cur_layer);
                                NEW_L1.insert(node, curlayer); // new L1 whose fanout will be
                                        checked later
                                L1_count[cur_pair] ++; Increment num latches of current pair
                        }; // end if
                }; // end while
                NETS = NULL; // done analyzing this set
                while (NEW_L1 || NEW_L2) {//ping pong between fanout of New L1's and fanin of
                        New L2's
                        while(node = foreach_TFOLatch_And_PO(NEW_L1) {
                                if (ALL_L1.is_member(node) || IsPO(node)) {
                                        REDUCIBLE = FALSE; // violates Reducible rules
                                        break;
                                }; // end if
                                if(!ALL_L2.is_member(node)) {
                                        ALL_L2.insert(node, cur_pair);
                                        NEW_L2.insert(node, cur_pair);
                                        L2_count[cur_pair] ++;
                                        NETS.push(node); // must look for latches downstream of this
                                                L2 latch
                                }; // end if
                        }; // end while
                        NEW_LI = NULL;
                        // foreach_TFILatch_And_PI is counterpart of . . . TFOLatch_And_PO which
                                traverses
                        // fanin looking for latches & PI's
                        while (node = foreach_TFILatch_And_PI(NEW_L2)) {
                                if (ALL_L2.is_member(node) || IsPI(node)) {
                                        REDUCIBLE = FALSE; // violates Reducible rules
                                        break;
                                }; // end if
                                if(!ALL_L1.is_member(node)) {
                                        ALL_L1.insert(node, cur_layer);
                                        NEW_L1.insert(node cur_layer);
                                }; // end if
```

-continued

APPENDIX A

```
            }; // end while
               NEW_L2 = NULL;
         }; // end while NEW L1/NEW L2 loop
         if (NETS != NULL) then { cur_pair ++ }; // increment current pair variable
      };
};
```

What is claimed is:

1. A method of reducing latch count in a model of a digital circuit, said method comprising:

determining whether a model of said digital circuit is reducible, said digital circuit model comprising primary inputs, primary outputs, and a plurality of latches comprised of level one (L1) and level two (L2) latch sets wherein said L1 and L2 latch sets lack one-to-one correspondence;

replacing at least one of said plurality of latches with combinational logic in said model whereby said model comprises fewer latches than said digital circuit and using said reduced latch count model to simulate said digital circuit.

2. The method of claim 1, wherein at least one output of said L2 latch set drives at least one input of said L1 latch set and further wherein the step of determining whether said digital circuit model is reducible comprises determining whether (a) the transitive fanin of said L1 latch set includes only said primary inputs of said digital circuit and outputs of said L2 latch set, (b) the transitive fanout of said L1 latch set includes only inputs to said L2 latch set, (c) the transitive fanin of said L2 latch set includes only outputs from said L1 latch set, and (d) the transitive fanout of said L2 latch set includes only said primary outputs of said digital circuit and inputs to said L1 latch set.

3. The method of claim 1, wherein the step of replacing at least one of said plurality of latches comprises:

identifying a replaceable latch set from the group consisting of said L1 latch set and said L2 latch set if said digital circuit model is reducible; and replacing, in said model, each latch of said replaceable latch set with combinational logic whereby a latch count of said model is less than a latch count of said digital circuit.

4. The method of claim 3, wherein the step of identifying said replaceable latch set comprises identifying said L1 latch set if an L1 latch count is greater than or equal to an L2 latch count and identifying said L2 latch set if said L2 latch count is greater than said L1 latch count.

5. The method of claim 3, wherein the step of replacing said replaceable latch set with combinational logic comprises replacing each latch of said replaceable latch set with a wire in said model.

6. The method of claim 3, wherein said the step of replacing said replaceable latch set includes providing means for retaining a predetermined initial condition of said primary outputs during an initial clock cycle.

7. The method of claim 3, wherein the step of replacing said replaceable latch set with combinational logic comprises replacing each latch of said replaceable latch set with a 2:1 mux.

8. The method of claim 7 wherein a "0" input of each said mux comprises a predetermined constant indicative of an initial output condition of a corresponding latch in said digital circuit.

9. The method of claim 8, further comprising adding an initialization latch to said model wherein said initialization latch drives a select input of each said mux and further wherein said initialization latch outputs a "0" during an initial cycle and a "1" thereafter.

10. The method of claim 9, wherein said replaceable latch set comprises said L2 latch set and further comprising adding a second set of 2:1 muxes to said model, wherein each of said second set of 2:1 muxes replaces an output signal of a corresponding L1 latch, wherein a select input of each of said second set of muxes is driven by said initialization latch and wherein the "0" input of each of said second set of muxes is driven by an input signal to said corresponding L1 latch and the "1" input is driven by an output terminal of said corresponding L1 latch.

11. The method of claim 1, further comprising, as an initial step, identifying minimal dependent pairs of L1–L2 sets and L2 latch sets comprising said digital circuit and iterating the steps of claim 1 for each said minimal dependent pair.

12. A storage medium configured with computer instructions for reducing latch count in a model of a digital circuit, said computer instructions, when executed, perform the method comprising:

determining whether said digital circuit model is reducible, said digital circuit comprising, primary inputs, primary outputs, and a plurality of latches comprised of a level one (L1) latch set and a level two (L2) latch set wherein said L1 and L2 latch sets lack one-to-one correspondence;

identifying a replaceable latch set from the group consisting of said L1 latch set and said L2 latch set if said digital circuit model is reducible;

replacing, in said model, each latch of said replaceable latch set with combinational logic whereby a latch count of said model is less than a latch count of said digital circuit: and using said reduced latch count model to simulate said digital circuit.

13. The storage medium of claim 12, wherein at least one output of said L2 latch set drives at least one input of said L1 latch set and further wherein the step of determining whether said digital circuit model is reducible comprises determining whether (a) the transitive fanin of said L1 latch set includes only said primary inputs of said digital circuit and outputs of said L2 latch set, (b) the transitive fanout of said L1 latch set includes only inputs to said L2 latch set, (c) the transitive fanin of said L2 latch set includes only outputs from said L1 latch set, and (d) the transitive fanout of said L2 latch set includes only said primary outputs of said digital circuit and inputs to said L1 latch set.

14. The storage medium of claim 12, wherein the step of determining whether said digital circuit model is reducible comprises:

a. traversing a transitive fanout path of a primary input to discover previously unidentified L1 latches and marking said digital circuit as irreducible if any of said L2 latches are encountered;

b. traversing a transitive fanout path of each previously unidentified L1 latch to discover previously unidentified L2 latches and marking said digital circuit as irreducible if any L1 latches are encountered;

c. traversing a transitive fanout and fanin path of each said previously unidentified L2 latch to discover any previously unidentified L1 latches and marking said digital circuit as irreducible if any L2 latches are encountered;

d. looping on steps b and c until no previously undiscovered L1 or L2 latches are encountered; and e. looping on steps a through d for each primary input of said digital circuit.

15. The storage medium of claim 14, wherein the step of determining whether said digital circuit model is reducible comprises:

a. initializing a REDUCIBLE variable as true, clearing said NET, L1, and L2 variables, and initializing L1 and L2 COUNT variables as 0, b. pushing a previously unchecked primary input of said digital circuit into said NET variable;

c. traversing a transitive fanout of said NET variable to discover previously unidentified L1 latches, adding each said previously unidentified L1 latch to said L1 variable, and setting said REDUCIBLE variable to false if any latches of said L2 variable are discovered;

d. clearing said NET variable;

e. for each said previously unidentified L1 latch discovered in step c, tracing its transitive fanout path to discover any previously unidentified L2 latches, adding each said previously unidentified L2 latch to said L2 variable and to said NET variable, and labeling said digital circuit as irreducible if any latches from said L1 variable are discovered;

f. for each said previously unidentified L2 latch discovered in the step e, tracing its transitive fanin path to identify any previously unidentified L1 latches, adding each said previously unidentified L1 latch to said L1 variable and labeling said digital circuit as irreducible if any latches from said L2 latch set are identified in said transitive fanin of each said previously unidentified L2 latch;

g. repeating steps e and f until no previously unidentified latches are discovered;

h. repeating steps b through f unless said NET variable is clear; and i. repeating steps a through h for each said primary input of said digital circuit.

16. The storage medium of claim 15, further comprising:

in step a, initializing L1 COUNT and L2 COUNT variables to 0;

in steps b and e, incrementing an L1 COUNT variable for each said previously undiscovered L1 latch; and in step d, incrementing an L2 COUNT variable for each previously undiscovered L2 latch.

17. A computer system comprising:

a storage medium comprising a representation of a digital circuit, said digital circuit representation comprising primary inputs, primary outputs, and a plurality of latches comprising an L1 latch set and an L2 latch set wherein the L1 and L2 latch set lack one-to-one correspondence;

a processor coupled to said storage medium, said processor suitable for executing computer instructions; and wherein said storage medium further comprises a plurality of computer instructions that upon execution determine whether said digital circuit representation is reducible and, if found to be reducible creating a model of said digital circuit representation wherein at least one of said plurality of latches of said digital circuit representation is replaced in said model by combinational logic whereby said model comprises fewer latches than said digital circuit representation, and using said reduced latch count model to simulate said digital circuit.

18. The computer system of claim 17, wherein said determining whether said digital circuit representation is reducible comprises determining whether (a) the transitive fanin of said L1 latch set includes only said primary inputs of said digital circuit representation and outputs of said L2 latch set, (b) the transitive fanout of said L1 latch set includes only inputs to said L2 latch set, (c) the transitive fanin of said L2 latch set includes only outputs from said L1 latch set, and (d) the transitive fanout of said L2 latch set includes only said primary outputs of said digital circuit representation and inputs to said L1 latch set.

19. The computer system of claim 17, wherein said creating of said model comprises:

identifying a replaceable latch set from the group consisting of said L1 latch set and said L2 latch set; and replacing, in said model, each latch of said replaceable latch set with combinational logic.

* * * * *